(12) United States Patent
Cheng et al.

(10) Patent No.: US 7,249,153 B2
(45) Date of Patent: Jul. 24, 2007

(54) DATA COMPRESSION USING CHEBYSHEV TRANSFORM

(75) Inventors: Andrew F. Cheng, Potomac, MD (US); S. Edward Hawkins, III, Ellicott City, MD (US); Lillian Nguyen, Ellicott City, MD (US); Christopher A. Monaco, Silver Spring, MD (US); Gordon G. Seagrave, Washington, DC (US)

(73) Assignee: The Johns Hopkins University, Baltimore, MD (US)

( * ) Notice: Subject to any disclaimer, the term of this patent is extended or adjusted under 35 U.S.C. 154(b) by 591 days.

(21) Appl. No.: 10/633,447

(22) Filed: Aug. 1, 2003

(65) Prior Publication Data
US 2004/0093364 A1  May 13, 2004

Related U.S. Application Data

(60) Provisional application No. 60/400,326, filed on Aug. 1, 2002.

(51) Int. Cl.
*G06F 15/00* (2006.01)
*G06F 17/14* (2006.01)
(52) U.S. Cl. ..................... 708/203; 708/400
(58) Field of Classification Search ............. 708/203, 708/400
See application file for complete search history.

(56) References Cited

U.S. PATENT DOCUMENTS 4,658,367 A * 4/1987 Potter ................. 702/111

6,051,027 A * 4/2000 Kapur et al. ............... 703/5

OTHER PUBLICATIONS

Corr et al., "Discrete Chebyshev Transform A Matural Modification of the DCT", 2000 IEEE, pp. 1142-1145.*

Anand R. Prasad; Audio Coding using Parametric Piecewise Modeling; IEEE ICPWC '99; 1999; pp. 414-418; IEEE, New York, New York.

Y. S. Zhu, S. W. Leung, Systolic Array Implementations for Chebyshev Nonuniform Sampling; IEEE; 1992; pp. IV-177 to IV-180; IEEE, New York, New York.

Gerard Leng; Compression of aircraft aerodynamic database using multivariable Chebyshev polynomials; Advances in Engineering Software 28 (1997); pp. 133-141; Elsevier Science Ltd.. Great Britain.

* cited by examiner

Primary Examiner—Chuong D. Ngo
(74) Attorney, Agent, or Firm—Francis A. Cooch

(57) ABSTRACT

The present invention is a method, system, and computer program product for implementation of a capable, general purpose compression algorithm that can be engaged "on the fly". This invention has particular practical application with time-series data, and more particularly, time-series data obtained form a spacecraft, or similar situations where cost, size and/or power limitations are prevalent, although it is not limited to such applications. It is also particularly applicable to the compression of serial data streams and works in one, two, or three dimensions. The original input data is approximated by Chebyshev polynomials, achieving very high compression ratios on serial data streams with minimal loss of scientific information.

27 Claims, 3 Drawing Sheets

Figure 3

| 68.5000 | -54.1716 | 21.5463 | 7.1606 | -16.2528 | 7.7577 | 3.7301 | -6.0795 | -0.3536 | 6.1444 | -4.2381 | -3.0574 | 7.8802 | -5.9449 | 0.6192 | 1.8917 |

DATA COMPRESSION USING CHEBYSHEV TRANSFORM

CROSS-REFERENCE TO RELATED APPLICATIONS

This application claims the benefit of prior filed U.S. provisional Application No. 60/400,326, filed on Aug. 1, 2002, the complete disclosure of which is incorporated fully herein by reference.

STATEMENT OF GOVERNMENTAL INTEREST

This invention was made with Government support under Contract No. NAG5-8688 awarded by the National Aeronautics and Space Administration (NASA). The Government has certain rights in the invention.

BACKGROUND OF THE INVENTION

1. Field of the Invention

This invention relates to the field of data compression.

2. Description of the Related Art

With the explosion of the digital age, there has been a tremendous increase in the amount of data being transmitted from one point to another. Data may be traveling within an office, within a country, from one country to another, from Earth to locations in outer space, or from locations in outer space back to Earth.

Increasingly capable instruments and ever more ambitious scientific objectives produce ever-greater data flows to scientists, and this is particularly true for scientific missions involving spacecraft. A large variety of compression algorithms have been developed for imaging data, yet little attention has been given to the large amount of data acquired by many other types of instruments. In particular, radar sounders, radar synthetic aperture mappers, mass spectrometers, and other such instruments have become increasingly important to space missions. Although the volume of scientific data obtained has grown with the increasing sophistication of the instruments used to obtain the data, spacecraft capabilities for telecommunications bandwidth have not grown at the same rate. The tightening constraints on spacecraft cost, mass, power, and size, limit the amount of resources that can be devoted to relaying the science data from the spacecraft to the ground. Competition for use of ground station resources, such as the NASA Deep Space Network, further limit the number of bits that can be transmitted to Earth.

One approach to increase the "scientific return" in the face of these constraints is to use data compression, as has been adopted for many NASA scientific missions. For example, the Galileo mission to explore the planet Jupiter and its moons has made extensive use of lossy image compression methods, such as the discrete cosine transform, after the high gain antenna of the Galileo spacecraft failed to deploy properly. By compressing the data, the Galileo team was able to capture data using the spacecraft's smaller, properly functioning antenna.

Other missions, like NEAR, make routine use of both lossless and lossy image compression to reduce data volume, employing several different algorithms. In both the NEAR and Galileo programs, scientists felt that the inevitable loss of information associated with data compression and decompression was more than compensated by the opportunity to return more measurements, that is, there is net scientific gain when more measurements are returned (or higher temporal/spatial/spectral resolution is achieved), even with loss of fidelity of data returned.

Standard image compression methods like discrete cosine transforms and related methods are optimized for image data and are not easily adaptable to the data streams from non-image sources (e.g., a spectrometer) or to time series data sources (those with a time component, such as video), and their performance characteristics (in terms of what information is lost by compression) are not necessarily optimal for such time series data. One reason for this is that image compression methods take advantage of 2-dimensional spatial correlations generally present in images, but such correlations are absent or qualitatively different in time-series data, such as data from a spectrometer or particle/photon counter. However, the need for compression of non-image data is growing and will continue to grow in the future. For example, hyper-spectral images from a scanning spectrograph are particularly high bandwidth but not suited for compression by standard techniques. Further, lossless compression methods such as Huffman encoding, run-length encoding, and Fast and Rico algorithms, and lossy methods such as straight quantization, provide relatively small compression rates. Thus, it would be desirable to significantly increase the time resolution of such an instrument within the bandwidth allocation currently available, and increase the compression ratio available when compressing this data, while still retaining the scientific value of the compressed data, and while being able to use the same compression method for single or multi-dimensional applications.

SUMMARY OF THE INVENTION

The present invention is a method, system, and computer program product for implementation of capable, general purpose compression that can be engaged "on the fly". This invention is applicable to the compression of any data type, including time-series data, and has particular practical application on board spacecraft, or similar situations where cost, size and/or power limitations are prevalent, although it is not limited to such applications. It is also particularly applicable to the compression of serial data streams and works in one dimension for time-series data; in two dimensions for image data; and in three dimensions for image cube data. The original input data is approximated by Chebyshev polynomials, achieving very high compression ratios on serial data streams with minimal loss of scientific information.

BRIEF DESCRIPTION OF THE DRAWINGS

FIG. 3 illustrates the result of applying the Chebyshev transform of a sample data set.

DESCRIPTION OF THE PREFERRED EMBODIMENT(S)

An embodiment of the present invention is described herein with reference to compression of data obtained by a spacecraft, however, it is understood that the claims of the present invention are intended to cover data compression of all kinds of data, for example, medical imaging data, data acquisition/logging applications, and the like. From a technical standpoint, a general purpose compression method for use on-board spacecraft should have the following properties: low computational burden, particularly in the compression step that occurs on-board the spacecraft where there is limited power and CPU cycles; flexibility to work in small data blocks without requiring any specific data block size; minimal demands on buffer memory to perform compression of real time data; compression and decompression of a data block completely independent of that in other blocks so there is minimum loss of information in the event of data dropouts or corruption; and high quantitative fidelity of decompressed data to the original data stream as measured by scientific information content. Use of Chebyshev polynomials as described herein meets all of these criteria.

Figure 1:
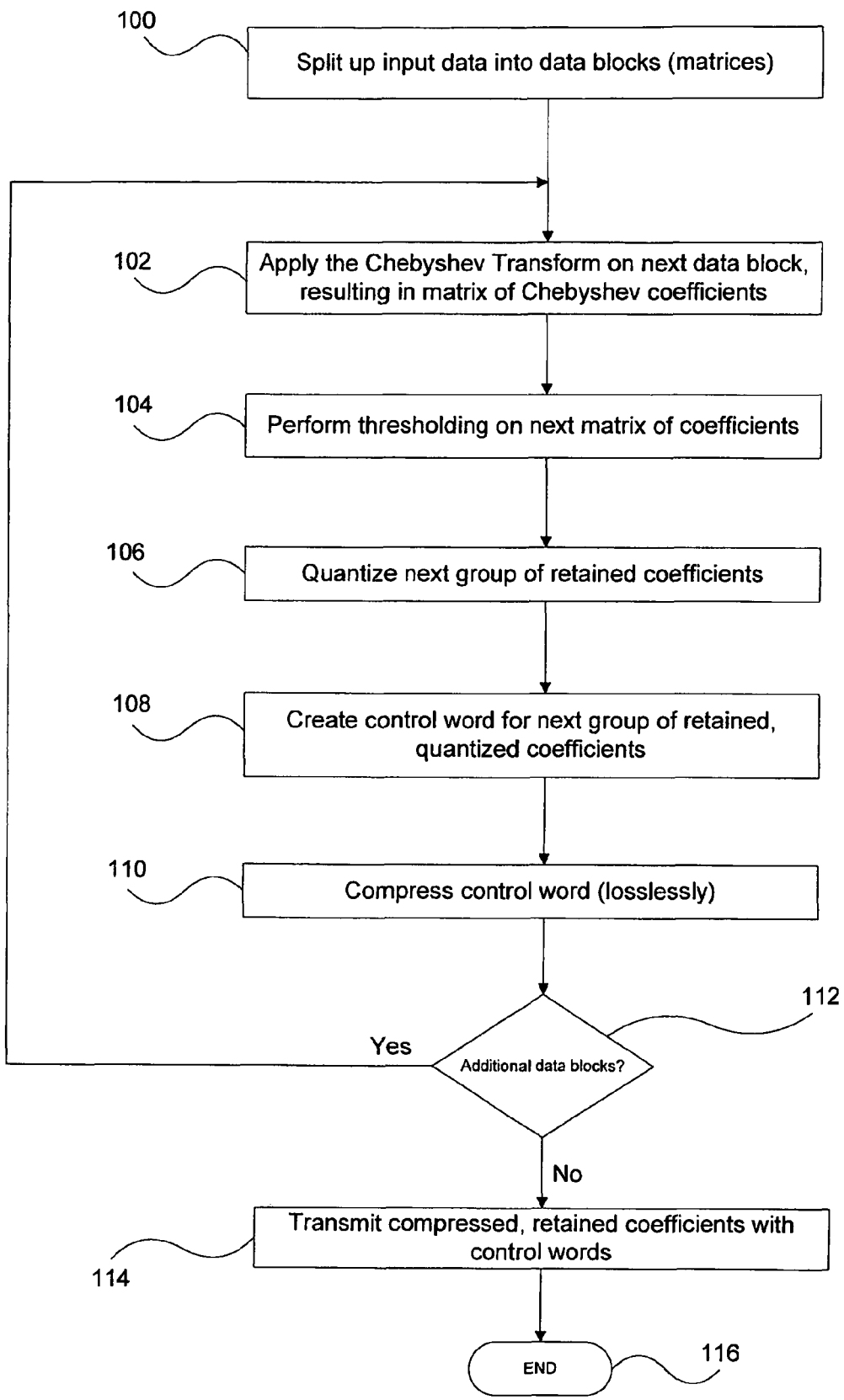
FIG. 1 is a flowchart illustrating the basic steps performed in accordance with the present invention.
Figure 2:
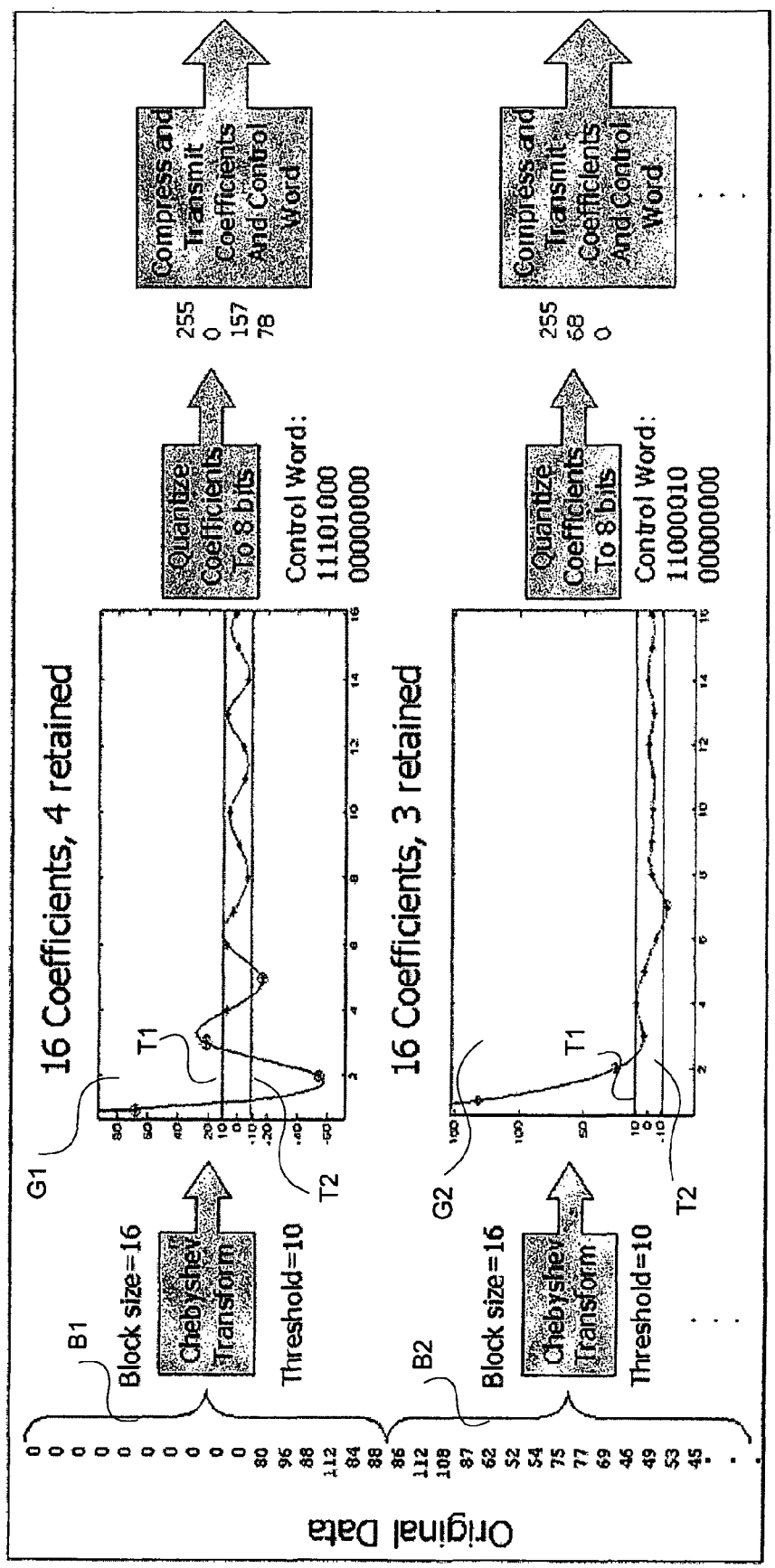
FIG. 2 is a block diagram of the steps of FIG. 1, containing a small sample of simulated time-series data.

FIG. 1 is a flowchart illustrating the basic steps performed in accordance with the present invention and FIG. 2 is a block diagram of the same steps, containing a small sample of simulated time-series data. At step 100, the original input data is divided into blocks to form a matrix of a predetermined size. For one-dimensional data, the size of each matrix will be N×1 (i.e., they will have a single "depth" dimension), while for two-dimensional applications, it is convenient, though not required to have the data matrices be square, i.e., N×N blocks and for three-dimensional applications it is convenient to have the data matrix be a code, i.e., N×N×N blocks. The optimal block size (the value of N) is a compromise among several factors and is not necessarily related to the bit depth. The "best" matrix size for a given application depends on the available computational resources and the nature of the data (i.e., what degree and types of information loss can be tolerated). A larger matrix size can give higher compression performance but will require more computation. Applicant has found N=8 and N=16 to be common acceptable choices though other choices are also acceptable.

For applications of the method in two or more dimensions, the original dataset to be compressed actually consists of "frames" that are sampled at a sequence of times. Each frame is an array of data values, in one or more dimensions. An example of a one-dimensional array making up a data frame would be the data from a line-scan imager (also called a whisk-broom imager), where the dimension in the data array is spatial. Another such example would be the data from a multichannel particle analyzer, where the dimension in the data array could be particle energy. Successive frames (a total of N) would be buffered and interleaved to produce N×M blocks, in which the first dimension is temporal and the other is that corresponding to the data frame of M samples. A second class of applications would be to datasets where each frame is a two dimensional array, such as for video imaging (two spatial dimensions) or for spectral imaging (one dimension spatial and one spectral). To apply the two-dimensional compression to this second class of datasets, successive frames also need to be buffered and interleaved, so that N×N blocks, for instance, are formed with time as one dimension. The other dimension is chosen by the user and is, for best performance, the dimension in which the data frames have greater redundancy of information. Since the application illustrated in FIG. 2 is a one-dimensional application, each matrix size is 16×1. As can be seen on the left side of FIG. 2, 32 data points are illustrated and they have each been divided into blocks (block B1, block B2) of 16 data points each.

At step 102, the Chebyshev transform is applied to a first data block (block B1 in FIG. 2). This results in, in this example, 16 Chebyshev coefficients for the data in block B1. The result of applying the Chebyshev transform to block B1 are shown in the matrix illustrated in FIG. 3.

At step 104, for each coefficient in the matrix (the matrix currently being processed), thresholding is performed. This is best illustrated in FIG. 2, where the results of the Chebyshev transform for each block are plotted on graphs G1 and G2. In the example of FIG. 2, a threshold of −10 to +10 has been established, as illustrated by the threshold lines T1 and T2 at these two points (on each graph). In accordance with the present invention, the thresholding step 104 involves the retention of coefficients larger than the given threshold (e.g., in this example, above 10 or below −10). Thus, data points 1, 2, 3, and 5 are retained and the coefficients for data points 4 and 6-16 are discarded.

At step 106, the retained coefficients (those retained after the thresholding process) are quantized. The quantizing is performed because the retained values can be large numbers that would require significant amounts of memory to store; if a floating-point processor is used, each number could be as large as 64 bits if stored as double-precision. By quantizing the retained values they can be reduced in size to as few as 8 or even 6 bits, depending upon how much compression is required and how much loss can be tolerated.

In the example of FIG. 2, the quantization is performed by mapping the amplitudes of the retained coefficients as follows:

The basic Chebyshev algorithm applies a quantizer with a fixed step size (uniform quantizer) to the coefficients retained after thresholding. For each block, the maximum and minimum coefficient values, $c_{max}$ and $c_{min}$, are stored and used to determine the quantizer step size. The quantized coefficients $Q(i)$ are calculated as follows:

$$Q(i) = (2^m - 1)\frac{(c(i) - c_{min})}{(c_{max} - c_{min})} \quad \text{for } i = 1, \ldots, N$$

where m is the number of bits to which the coefficients are quantized, N is the block size, and c(i) is the $i^{th}$ retained coefficient in the block. The distortion introduced by uniform quantization can be measured by setting the threshold to zero in the Chebyshev algorithm, forcing the algorithm to retain and quantize all coefficients.

Basically, for each plot, the largest and smallest coefficient amplitude is kept and is used to linearly map the other amplitudes into the range 0 to $2^8$ (0 to 255) where 8 is the number of bits being used to store the coefficients. It is noted that the number of bits can be any number, and the larger the number, the more accurate the reconstructed signal will be, but the lower will be the compression ratio.

The Chebyshev coefficients tend to quickly approach zero as j (see equation 5 below) increases. The distribution of coefficient values therefore has a higher mass near zero, and approximating the coefficients better in this high probability region will reduce quantization distortion. This can be achieved by expanding the quantization intervals near zero using a compander function, then uniformly quantizing. A compander compresses dynamic range on encode and expands dynamic range on decode. Ideally the Chebyshev coefficient compander will stretch values near zero while compressing values near the coefficient maximum and minimum.

Several compander functions will work to expand the quantization intervals near zero, including logarithmic and trigonometric functions, as well as the Mu-law and A-law companders generally used for reducing dynamic range in audio signals before quantization. The inverse hyperbolic sine function was found by the applicant to perform particularly well in expanding Chebyshev coefficients near the origin and compressing coefficients away from the origin.

If the high frequency coefficients cluster near zero, the compander almost entirely smoothes out the high frequency noise. But along with the advantage of reducing high frequency distortion comes the disadvantage of an often poorly represented DC coefficient. This problem is easily solved by storing the DC coefficient separately and applying the compander only to the AC coefficients.

Other known techniques for quantization can be performed, for example, floating point quantization. An example using floating-point quantization is discussed in more detail below in connection with a two-dimensional example.

At step 108, a bit control word is created so that the retained data points can be inserted at the appropriate location in the data signal when it is decompressed, and so that place holders (e.g., zeroes) can be inserted in the appropriate locations where data points have not been retained. In the one-dimensional application illustrated in FIG. 2, since the matrix is a 16×1 matrix, there will be 16 bits in each control word; for an N×N, or N×M matrix (where M is the depth of the matrix), there will be N×N or N×M bits in the control words, respectively. In the example of FIG. 2, the control word for the first data block, block B1, is 1110100000000000. This indicates to the decompression program that the first three bits (the first three "ones") will contain a data bit to be decompressed or reconstructed, the fourth bit (designated by the "0"), will contain a place holder, the fifth bit ("1") will contain a reconstructed data point, and the remaining bits (all zeroes) will be given place holders.

At step 110, the control word created in step 108 can be encoded using lossless compression techniques (an example of which is given in more detail below). By compressing the control word the compression ratio can be significantly increased without any additional data loss.

At step 112, a determination is made as to whether or not there are additional data blocks to be processed. Since the data is processed on the fly, data blocks may be continuously accumulating. If there are additional data blocks to be processed at this time, the process proceeds back to step 102, for processing of the next data block. If not, the process proceeds to step 114.

At step 114, the compressed data can be transmitted with its control word so that, upon receipt, decompression can take place by, for example, applying the inverse transform as described below.

Thus, as noted above, the Chebyshev algorithm is based on three parameters: first, block size, which is the number of samples used per iteration of the compression method; second, the threshold level, the minimum value of the coefficients to be retained; and third, the number of bits, which is the number of bits to which each coefficient is quantized. By varying the parameters for different types of data, good compression ratios can be achieved with minimal error. Higher threshold values always result in better compression ratios at the expense of reconstructed signal quality. Increasing the number of bits generally decreases compression ratio due to the additional bits stored, but gives better reconstructed signal quality. Increasing the block size has more varied results, but a large block size generally increases the compression ration because not as many block maxima and minima are being stored.

Following is an example of a preferred embodiment of the present invention used in connection with two-dimensional data (e.g., image data).

EXAMPLE

Algorithm Outline

Onboard the spacecraft, divide the image into square blocks. To each block:
Apply the Chebyshev transform
Eliminate the low-amplitude transform coefficients
Quantize the retained coefficients
Encode and transmit the retained coefficients
On the ground, decode and apply block artifact reduction algorithm (optional).

Onboard Operations

Step 1: Block Processing

Divide the image into N×N blocks (N=8 in this example). Each block will then have the form $$F = \begin{bmatrix} f_{11} & f_{12} & \cdots & f_{1N} \\ f_{21} & f_{22} & \cdots & f_{2N} \\ \vdots & \vdots & \ddots & \vdots \\ f_{N1} & f_{N2} & \cdots & f_{NN} \end{bmatrix}$$

where $f_{ij}$ is the $ij^{th}$ pixel in the block.

This will require buffering N rows of the image before the first block can be processed.

If the image size cannot be divided evenly by N, up to N−1 rows and up to N−1 columns need to be padded with the adjacent pixel value.

Step 2: Transform

Apply the Chebyshev transform to each block:

$$c_{ij} = \frac{4}{N^2} \sum_{k=1}^{N} \sum_{m=1}^{N} f_{mk} T_{im} T_{jk}$$

where $$T_{ij} = \cos\left(\frac{\pi(i-1)\left(j-\frac{1}{2}\right)}{N}\right), \quad i, j = 1, \ldots, N.$$

$c_{ij}$ is the $ij^{th}$ Chebyshev transform coefficient and $T_{ij}$ is a cosine lookup table stored onboard the spacecraft.

The transform can also be written in matrix form, $$c = \frac{4}{N^2} T F T^t.$$

Step 3: Thresholding

Set all coefficients, $c_{ij}$, whose absolute value is less than a commanded threshold value to zero. The exception is the first coefficient, $c_{11}$, which has the highest amplitude and is always retained. The retained coefficients are defined by $$c'_{ij} = \begin{cases} c_{ij}, & i = j = 1 \\ c_{ij}, & |c_{ij}| \geq \text{threshold}, \quad i, j = 1, \ldots, N \\ 0, & \text{otherwise} \end{cases}$$

This results in a matrix whose elements are primarily zero. Only the nonzero coefficients are quantized, encoded, and transmitted.

Step 4: Quantization

Quantize the retained (non-zero) coefficients by rounding the mantissa of the binary representation to P bits (sign bit included), and storing only Q positive bits in the binary exponent (because the threshold value will always be greater than 1.0, the need for negative exponents is eliminated, saving one bit per retained coefficient).

The specific steps are:
1) Convert each coefficient to its binary representation, retaining the sign bit (0 positive, 1 negative)
2) Shift the radix point to the leading 1 and increment the exponent (normalization).
3) Retain the sign bit and P−1 bits beyond the radix point, rounding if the next bit is a 1. Do not store the leading 1 in the mantissa. It is assumed and will save us 1 bit.
4) Retain the exponent as a Q-bit value.
5) Convert the Q exponent bits and the P mantissa bits (sign bit leading) to a decimal integer.

For example, quantize the floating-point value 673.4375 to 8 bits using a mantissa of P=4 bits and an exponent of Q=4 bits. Following the steps above,
1) The binary representation is 0 10101000001.0111 (the sign bit leads)
2) Normalized: 0 1.01010000010111×$2^9$
3) Retain the 4 bits 0 011 in the mantissa (note that 1.0101 was rounded to obtain 1.011, and the leading 1 was not retained).
4) Retain the exponent 9 (1001 in Q=4-bit binary)
5) Convert the exponent bits followed by the sign bit and the mantissa bits (1001 0 011) to an integer: 147

The leading 1 in the normalization is assumed and must be replaced when converting back to floating point. The restored floating-point value is then +1.011×$2^9$, or 704.

For 12-bit planetary images compressed using 8×8 blocks, Q=4 bits are stored in the exponent of all thresholded Chebyshev coefficients. The mantissa of coefficient $c_{11}$ is rounded to P=7 bits (6 bits plus sign bit), and the mantissa of all other coefficients is rounded to P=4 bits (3 bits plus sign bit).

By placing the exponent in the most significant bits of the quantized coefficient and the mantissa in the least significant bits, more efficient lossless encoding (step 8) is achieved. For the lossless encoding step, the quantized values are treated as integers.

Step 5: Control Word

A 'control word' stores the original matrix location of each coefficient in a block and must be transmitted along with the retained coefficients.

The control word cw for any given block is defined by mapping each coefficient to either 0 (if it set to zero after thresholding) or to 1:

$$cw = \begin{cases} 0, & c'_{ij} = 0 \quad i, j = 1, \ldots, N \\ 1, & \text{otherwise} \end{cases}.$$

Step 6: Zigzag Scan

After thresholding, most of the non-zero coefficients will be clustered in the upper left hand corner of the coefficient matrix. Map both the coefficient matrix and the control word matrix to a vector using a zigzag scan. This enables more efficient run-length encoding of the control word cw and coefficient matrix $c'_{ij}$.

For an 8×8 matrix, the zigzag mapping is defined by $$\begin{bmatrix} c_{11} & c_{12} & \cdots & c_{18} \\ c_{21} & c_{22} & \cdots & c_{28} \\ \vdots & \vdots & \ddots & \vdots \\ c_{81} & c_{82} & \cdots & c_{88} \end{bmatrix} \Rightarrow$$

$[c_{11} c_{12} c_{21} c_{31} c_{22} c_{13} c_{14} c_{23} c_{32} c_{41} c_{51} c_{42} c_{33} c_{24} c_{15} c_{16} c_{25} c_{34} c_{43} c_{52} c_{61} c_{71} c_{62}$
$c_{53} c_{44} c_{35} c_{26} c_{17} c_{18} c_{27} c_{36} c_{45} c_{54} c_{63} c_{72} c_{81} c_{82} c_{73} c_{64} c_{55} c_{46} c_{37} c_{28} c_{38}$
$c_{47} c_{56} c_{65} c_{74} c_{83} c_{84} c_{75} c_{66} c_{57} c_{48} c_{58} c_{67} c_{76} c_{85} c_{86} c_{77} c_{68} c_{78} c_{87} c_{88}].$

For example, the thresholded coefficient matrix, $$c' = \begin{bmatrix} c_{11} & c_{12} & 0 & c_{14} & c_{15} & 0 & 0 & 0 \\ c_{12} & c_{22} & c_{23} & 0 & 0 & 0 & 0 & 0 \\ c_{31} & 0 & 0 & 0 & 0 & 0 & 0 & 0 \\ 0 & c_{42} & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix},$$

is mapped to the vector
$[c_{11} \ c_{12} \ c_{21} \ c_{31} \ c_{22} \ 0 \ c_{14} \ c_{23} \ 0 \ 0 \ 0 \ c_{42} \ 0 \ 0 \ c_{15} \ 0 \ 0 \ 0 \ldots 0]$,
and the corresponding control word, $$cw = \begin{bmatrix} 1 & 1 & 0 & 1 & 1 & 0 & 0 & 0 \\ 1 & 1 & 1 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix},$$

is mapped to
$[1 \ 1 \ 1 \ 1 \ 1 \ 0 \ 1 \ 1 \ 0 \ 0 \ 0 \ 1 \ 0 \ 0 \ 1 \ 0 \ 0 \ 0 \ldots 0]$.

Step 7: Control Word Encoding

To run-length encode the control word vector, it is truncated after the last 1 and a length specifier telling how many bits are in the truncated control word is transmitted. Two extra bits are saved by eliminating the leading and trailing 1s of the truncated control word vector (the control word vector always begins with 1 because $c_{11}$ is always retained, and it always ends in 1 by definition of the truncation). The length specifier contains $\log_2(N^2)$ bits (6 bits for 8×8 blocks).

In the example above, the transmitted coefficients are
$[c_{11} \ c_{12} \ c_{21} \ c_{31} \ c_{22} \ c_{14} \ c_{23} \ c_{42} \ c_{15}]$.
The truncated control word vector is
$[1 \ 1 \ 1 \ 1 \ 1 \ 0 \ 1 \ 1 \ 0 \ 0 \ 0 \ 1 \ 0 \ 0 \ 1]$.
After eliminating the leading and trailing 1s, the control word vector becomes
$[1 \ 1 \ 1 \ 1 \ 0 \ 1 \ 1 \ 0 \ 0 \ 0 \ 1 \ 0 \ 0]$.
The control word is now 13 bits in length, so the length specifier (in 6-bit binary) is
$[0 \ 0 \ 1 \ 1 \ 0 \ 1]$.

The length specifier and control word are transmitted along with the quantized coefficients.

The exception to the above-described encoding scheme is when $c_{11}$ is the only coefficient retained. In that case, the 64-bit control word vector is

[1 0 0 0 . . . 0].

After truncation and elimination of the leading 1 (which is also the trailing 1), 0 bits are retained in the control word vector, so 0 bits are transmitted. This special case will be encoded with a length specifier of all 1s,

[1 1 1 1 1 1].

When the decoder sees a length specifier containing all 1s, it will not read a control word and will know that exactly one coefficient was retained in that block, namely $c_{11}$.

Step 8: Coefficient Encoding (Lossless)

The quantized coefficients (step 4) are losslessly encoded using DPCM followed by Rice encoding. This is achieved by first grouping together M blocks of the image (M to be determined by transmission packet size and desired compression ratio—the larger the compression ratio and packet size, the larger M). The M blocks of data are processed as in steps 1-7, quantized coefficients are grouped together based on their block index in preparation for loseless compression. The order of the indices is chosen according to the zig-zag scan described above.

The quantized coefficients $c^m_{ij}$ ($1 \leq i, j \leq 8$, $1 \leq m \leq M$), in the M blocks $$\begin{bmatrix} c^1_{11} & c^1_{12} & \cdots & c^1_{18} \\ c^1_{21} & c^1_{22} & \cdots & c^1_{28} \\ \vdots & \vdots & \ddots & \vdots \\ c^1_{81} & c^1_{82} & \cdots & c^1_{88} \end{bmatrix}, \begin{bmatrix} c^2_{11} & c^2_{12} & \cdots & c^2_{18} \\ c^2_{21} & c^2_{22} & \cdots & c^2_{28} \\ \vdots & \vdots & \ddots & \vdots \\ c^2_{81} & c^2_{82} & \cdots & c^2_{88} \end{bmatrix},$$

$$\cdots, \begin{bmatrix} c^M_{11} & c^M_{12} & \cdots & c^M_{18} \\ c^M_{21} & c^M_{22} & \cdots & c^M_{28} \\ \vdots & \vdots & \ddots & \vdots \\ c^M_{81} & c^M_{82} & \cdots & c^M_{88} \end{bmatrix}$$

are grouped as follows:

The M 11-bit coefficients:

$[c^1_{11} c^2_{11} \ldots c^M_{11}]$

The variable number of 8-bit coefficients:

$[c^1_{12} c^2_{12} \ldots c^M_{12} c^1_{21} c^2_{21} \ldots c^M_{21} c^1_{31} c^2_{31} c^2_{31} \ldots c^M_{31} \ldots c^1_{88} c^2_{88} \ldots c^M_{88}]$.

(Note that many of the $c^m_{ij}$ are set to zero by thresholding and are not transmitted.)

DPCM encoding followed by Rice compression is then applied first to the stream of 11-bit coeficients, and then to the stream of 8-bit coefficients. This coefficient ordering ensures that the difference between successive coefficients is small enough to make DPCM followed by Rice encoding more efficient than had the coefficients been grouped in some other order.

Step 9: Transmission

Each group of M blocks is transmitted in one packet. Transmitted first is a packet header. The header might contain information about the location in the image of the starting block, and the number M of blocks in the packet. Next to be transmitted are the M 6-bit control word length specifiers, then the M truncated control words, then the losslessly encoded coefficients.

EXAMPLE

Transmission of M=3 8×8 blocks:

Block 1:
After thresholding all coefficients except for $c_{11}$=10884.0 and $c_{21}$=−111.085(are zeroed.
The quantized coefficients are then
[$c_{11}$ $c_{21}$]=[10880 −112],
or, after converting to binary according to step 4,
[1101 0 010101 0110 1 110],
which when converted to integers are
[1685 110].
The control word vector is
[1 0 1 0 0 0 . . . 0].
After truncation and removal of leading and trailing 1s, the control word vector becomes
[0],
and the corresponding length specifier is 1, or
[0 0 0 0 0 1].

Block 2:
After thresholding all coefficients except for $c_{11}$=12019.67, $c_{12}$=−347.118, and $c_{21}$=89.045 are zeroed.
The quantized coefficients are then
[$c_{11}$ $c_{12}$ $c_{21}$]=[12032−352 88],
or, after converting to binary according to step 4,
[1101 0 011110 1000 1 011 0110 0 011],
which when converted to an integers are
[1694 139 99].
The control word vector is
[1 1 1 0 0 0 . . . 0].
After truncation and removal of leading and trailing 1s, the control word vector becomes
[1],
and the corresponding length specifier is 1, or
[0 0 0 0 0 1].

Block 3:
After thresholding all coefficients except for $c_{11}$=7932.9 are zeroed.
The quantized coefficients are then
[$c_{11}$]=[7936],
or, after converting to binary according to step 4,
[1100 0 111100],
which when converted to an integer is
[1596].

The control word vector is
[1 0 0 0 0 0 . . . 0].
This is the special case where no bits are transmitted for the control word and the corresponding length specifier contains all 1s, or
[1 1 1 1 1 1].
DPCM and Rice encoding is then applied first to the $c_{11}$ coefficients (which are 11-bit values):
[1685 1694 1596], then to the remaining coefficients (which are all 8-bit values) in the order described in step 8:
[139 110 99].
This lossless compression results in some binary stream of values:
[($c_{11}$ binary stream) (remaining coefficient binary stream)].
Without the header, the transmission stream for this packet containing M=3 blocks is then $$\underbrace{0\;0\;0\;0\;0\;1}_{\text{Block 1}}\underbrace{0\;0\;0\;0\;0\;1}_{\text{Block 2}}\underbrace{1\;1\;1\;1\;1\;1}_{\text{Block 3}}$$
$$\text{6-bit length specifiers}$$

$$\underbrace{0}_{\text{Block 1}}\;\underbrace{1}_{\text{Block 2}}\;\underbrace{-}_{\text{Block 3}}\quad\underbrace{\text{[binary stream]}}_{\substack{\text{losslessly}\\\text{compressed}\\\text{transform}\\\text{coefficients}}}$$
$$\text{control word}$$

Ground Operations

Decoding

Decoding occurs on a block-by-block basis. The coefficients are read from the transmission stream and decoded. The decompression is achieved by applying the inverse Chebyshev transform to the reconstructed coefficient matrix, $$g_{ij} = \frac{1}{4}c_{11} - \frac{1}{2}\left(\sum_{k=1}^{N} c_{k1}T_{kj} + \sum_{m=1}^{N} c_{1m}T_{mi}\right) + \sum_{m=1}^{N}\sum_{k=1}^{N} c_{km}T_{kj}T_{mi}$$

where $$T_{ij} = \cos\left(\frac{\pi(i-1)\left(j-\frac{1}{2}\right)}{N}\right), i, j = 1, \ldots, N,$$

and $g_{ij}$ are the decompressed pixels.

Block Artifact Reduction (Optional)

Block artifacts are jumps in the pixel values from one block edge to the adjacent block edge, and are more apparent in highly compressed images. They can be reduced without losing any image detail by adding a gradient correction matrix $P_{B_k}$ to each block $B_k$, where k is the number of blocks in the image. The correction matrix adjusts the pixel values such that the adjacent edges of any two blocks have the same means.

The correction matrix for a block is defined by $P_{B_k}=a+bX+cY+dX^*X+eY^*Y$, $k=1,\ldots$, number of blocks where $$X = \begin{bmatrix} 0 & 1 & \cdots & 7 \\ 0 & 1 & \cdots & 7 \\ \vdots & \vdots & \ddots & \vdots \\ 0 & 1 & \cdots & 7 \end{bmatrix}, Y = \begin{bmatrix} 0 & 0 & \cdots & 0 \\ 1 & 1 & \cdots & 1 \\ \vdots & \vdots & \ddots & \vdots \\ 7 & 7 & \cdots & 7 \end{bmatrix},$$

and * represents the element-by-element product of two matrices.

The correction coefficients {a,b,c,d,e} can be found by solving a system of equations formed by applying 5 conditions on the block:

1) The average value of $P_{B_k}$ over the block $B_k$ is zero:

$0=\overline{P_{B_k}}=a+b\overline{X}+c\overline{Y}+d\overline{X^*X}+e$
$\overline{Y^*Y}=a+3.5b+3.5c+17.5d+17.5e$ 2)-5) The mean value of each edge of the block matches the mean of the adjacent block's edge.

If we label the edges of a given block B as follows $$\begin{array}{c} E_1 \\ E_4\;\boxed{B}\;E_2, \\ E_3 \end{array}$$

with $E_1$ representing the top row of pixels in the block, $E_2$ the right-most column of pixels, $E_3$ the bottom row, and $E_4$ the left-most column, then for each block B we can write 2)-5) as $\delta E_i = a + b\overline{X_{E_i}} + c\overline{Y_{E_i}} + d\overline{(X^*X)_{E_i}} + e\overline{(Y^*Y)_{E_i}}$, where i=1, 2, 3, 4 and $\delta E_i$ is the average of the difference of the means of adjacent block edges.

For example, if we have the following configuration of blocks $$\begin{array}{ccc} & B_1 & \\ B_2 & B_3 & B_4 \\ & B_5 & \end{array}$$

then, for block $B_3$, $$\delta E_1 = \frac{1}{2}\left[\frac{1}{N}\left(\sum_{j=1}^{N} g_{1j}^{B_3} - \sum_{j=1}^{N} g_{Nj}^{B_1}\right)\right],$$

$$\delta E_2 = \frac{1}{2}\left[\frac{1}{N}\left(\sum_{j=1}^{N} g_{jN}^{B_3} - \sum_{j=1}^{N} g_{j1}^{B_4}\right)\right],$$

$$\delta E_3 = \frac{1}{2}\left[\frac{1}{N}\left(\sum_{j=1}^{N} g_{Nj}^{B_3} - \sum_{j=1}^{N} g_{1j}^{B_5}\right)\right],$$

$$\delta E_4 = \frac{1}{2}\left[\frac{1}{N}\left(\sum_{j=1}^{N} g_{j1}^{B_3} - \sum_{j=1}^{N} g_{jN}^{B_2}\right)\right],$$

where $g_{ij}^{B_k}$ is the $ij^{th}$ reconstructed pixel in block $B_k$.

Equations 1)-5) can be written as the matrix equation $$\begin{bmatrix} 1 & 3.5 & 3.5 & 17.5 & 17.5 \\ 1 & 3.5 & 0 & 17.5 & 0 \\ 1 & 7 & 3.5 & 49 & 17.5 \\ 1 & 3.5 & 7 & 17.5 & 49 \\ 1 & 0 & 3.5 & 0 & 17.5 \end{bmatrix}\begin{bmatrix} a \\ b \\ c \\ d \\ e \end{bmatrix} = \begin{bmatrix} 0 \\ \delta E_1 \\ \delta E_2 \\ \delta E_3 \\ \delta E_4 \end{bmatrix},$$

and can be solved for {a,b,c,d,e} by taking the inverse of the matrix. Using {a,b,c,d,e}, the correction matrix $P_{B_k}$ can be calculated. The gradient-corrected pixel value $g'_{ij}$ for block $B_k$ is then $g_{ij}=g'_{ij}+P_{B_k}$ where $i, j=1,\ldots, N$.

If an edge of a given block lies on the border of the image, $\delta E_i$ for that edge is set to zero.

Chebyshev approximation is well-known; however, for the purpose of simplifying the explanation of the above-described inventive process, it is described in more detail below.

The Chebyshev polynomials of the first kind are defined by $T_n(x)=\cos(n \arccos x)$. These are orthogonal polynomials of degree n on the interval $-1 \le x \le 1$, with the weight $1/\sqrt{1-x^2}$. They satisfy the continuous orthogonality relation $$\int_{-1}^{1} \frac{T_i(x)T_j(x)}{\sqrt{1-x^2}} dx = \begin{cases} 0, & i \ne j \\ \frac{\pi}{2}, & i = j \ne 0 \\ \pi, & i = j = 0. \end{cases} \quad \text{Equation (1)}$$

The polynomial $T_n(x)$ has n zeros on the interval $[-1, 1]$, at $$x_k = \cos\left(\frac{\pi\left(k-\frac{1}{2}\right)}{n}\right) \quad \text{Equation (2)}$$

for $k=1, 2, \ldots, n$. When $T_m(x)$ is evaluated at its m zeros $x_k$ ($k=1, \ldots, m$) given by (2), the polynomials of degree i, $j<m$ also satisfy the discrete orthogonality relation $$\sum_{k=1}^{m} T_i(x_k)T_j(x_k) = \begin{cases} 0, & i \ne j \\ m/2, & i = j \ne 0 \\ m, & i = j = 0. \end{cases} \quad \text{Equation (3)}$$

The Chebyshev approximation of order N to a function $f(x)$ is defined by an expansion in terms of Chebyshev polynomials, $$f(x) \approx \left[\sum_{k=0}^{N-1} c_k T_k(x)\right] - \frac{c_0}{2}, \quad \text{Equation (4)}$$

where the N coefficients are given by $$c_j = \frac{2}{N}\sum_{k=1}^{N} f(x_k)T_j(x_k) \quad \text{Equation (5)}$$

for $j=0, \ldots, N-1$, and $x_k$ are as before the zeros of $T_N(x)$.

The Chebyshev approximation is exact on the N zeros of the polynomial $T_N(x)$ in $[-1, 1]$. A suitable transformation from Equation (2) enables the N zeroes to give equal intervals along the x-axis. Furthermore, the Chebyshev approximation has an equal error property, whereby the error of the approximation is distributed almost uniformly over the fitting interval, so it is an excellent approximation to the so-called min-max polynomial which has the least value of the maximum deviation from the true function in the fitting interval. Most important, the Chebyshev approximation can be truncated to a polynomial of much lower degree that retains the equal error property. These mathematical properties of the Chebyshev polynomials are key to their usefulness for approximation and interpolation, as well as for compression of time series data.

The Chebyshev compression algorithm is a form of transform encoding applied to data blocks. This category of algorithm takes a block of data (1- or 2-dimensional) and performs a unitary transform, quantizes the resulting coefficients, and transmits them. Many types of transforms have been used for image compression, including Fourier series (FFT), Discrete Cosine (DCT), and wavelet transforms.

The Chebyshev polynomials are related to the DCT as shown in Equation (2). The Chebyshev approximation, because of the equal error and min-max properties, is particularly suitable for compression of time-series data, independent of correlations.

The actual implementation of the Chebyshev approximation to achieve the present invention is numerically simple and the computational burden is low as shown by Equation (5). It is necessary only to calculate linear combinations of data samples with a small number of known, fixed coefficients. Because the coefficients $T_j(x_k)$ given in Equation (5) are known, they need not be calculated by the processor, but rather are stored as a table look-up or loaded into memory in advance.

The Chebyshev approximation in accordance with the present invention can be programmed using the high level language IDL, although other languages can also be used. By way of example, an IDL-language embodiment is described. A compression routine was written in which three parameters could be modified to evaluate the technique. These included the following:

Block Size The number of samples of the serial data stream during one iteration of the compression method. The routine continues to process "blocks" of the raw data until the entire data set has been compressed.

Threshold An adjustable parameter to balance high compression factors without excessive loss of precision. The threshold value will determine the number of coefficients retained within a block of the serial data stream.

Bits The number of bits returned from each retained Chebyshev coefficient.

To provide some insight into the Chebyshev method of the present invention, consider a serial data set of N measurements taken in blocks of m samples. Initially, coefficients for all m samples within a block are calculated. Because the Chebyshev approximation is exact on the m zeros of the polynomial, retaining all of these m coefficients preserves the original data within the block exactly (within round-off errors). By thresholding the coefficients, it is possible to reduce the number of coefficients needed to reconstruct the original m samples with sufficient accuracy to be scientifically useful. However, it is necessary to record which of the m coefficients within a block have been retained (as well as the coefficients themselves) in order to reconstruct the data accurately. It is more efficient to use larger block sizes, but there is a trade-off with accuracy.

For JPEG or similar algorithms, a variance analysis is done on a representative data set and the bit allocation is fixed for a particular type of data. A key advantage of the Chebyshev approximation of the present invention is that simple thresholding of the coefficients can be computed in real time on the actual data. This thresholding technique accomplishes the same purpose of the variance analysis in other algorithms because of the equal error and min-max properties of the Chebyshev polynomials.

The Chebyshev compression method of the present invention differs from standard lossy-compression techniques such as the Graphics Interchange Format (GIF) or the Joint Photographic Experts Group (JPEG) or the Discrete Cosine Transform (DCT) in that the Chebyshev technique does not rely on 2-dimensional correlations in a data set. In fact, one of the advantages to the block encoding performed by this method is that it works extremely well on serial (1-dimensional) data. The min-max and equal error properties ensure high fidelity in the reconstructed data with absolute errors roughly independent of the signal strength. This has the consequence that the data compression tends to suppress noise but still reproduces the high signal-to-noise peaks in the data with maximum percentage accuracy. Applicants are aware of no comparable compression techniques that are as computationally simple and that work as well on time-series data. These data sets are typical of instruments used in many areas of space science (for example, hyperspectral data, spectra, particle instruments, magnetometers, etc.).

The above-described steps can be implemented using standard well-known programming techniques. The novelty of the above-described embodiment lies not in the specific programming techniques but in the use of the steps described to achieve the described results. Software programming code which embodies the present invention is typically stored in permanent storage of some type, such as permanent storage of a processor located on board a spacecraft. In a client/server environment, such software programming code may be stored with storage associated with a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

It will be understood that each element of the illustrations, and combinations of elements in the illustrations, can be implemented by general and/or special purpose hardware-based systems that perform the specified functions or steps, or by combinations of general and/or special-purpose hardware and computer instructions.

These program instructions may be provided to a processor to produce a machine, such that the instructions that execute on the processor create means for implementing the functions specified in the illustrations. The computer program instructions may be executed by a processor to cause a series of operational steps to be performed by the processor to produce a computer-implemented process such that the instructions that execute on the processor provide steps for implementing the function specified in the illustrations. Accordingly, the figures herein support combinations of means for performing the specified functions, combinations of steps for performing the specified functions, and program instruction means for performing the specified functions.

While there has been described herein the principles of the invention, it is to be understood by those skilled in the art that this description is made only by way of example and not as a limitation to the scope of the invention. For example, while specific implementations in one and two-dimensional applications are described in detail herein, three-dimensional data can be compressed using the same inventive method and specific implementations for doing so are intended to be covered by the present claims and will be readily apparent to artisans of ordinary skill. Accordingly, it is intended by the appended claims, to cover all modifications of the invention which fall within the true spirit and scope of the invention.

Invention claimed is:

1. A method of compressing data, comprising the step of approximating said data using Chebyshev polynomials, further comprising the step of:
dividing said data into data blocks of a predetermined size, to form matrices corresponding to each data block;
transforming the data in each matrix using Chebyshev polynomials to form corresponding matrices of Chebyshev coefficients; and
creating compressed data using the Chebyshev coefficients.

2. The method of claim 1, said creating compressed data using the Chebyshev coefficients further comprising the step of:
thresholding the Chebyshev coefficients in each matrix to retain in each matrix only Chebyshev coefficients that are of a predetermined value.

3. The method of claim 2, further comprising the step of:
quantizing said Chebyshev coefficient matrices to create a compressed data block corresponding to each of said data blocks.

4. The method of claim 3, further comprising the step of:
creating control words for each of said compressed data blocks, said control enabling decompression of said compressed data blocks in proper sequence.

5. The method of claim 4, wherein said quantizing step comprises at least the step of:
performing floating point quantization on said Chebyshev coefficient matrices.

6. The method of claim 4, wherein said quantizing step comprises at least the step of:
performing inverse hyperbolic sine compander quantization on said Chebyshev coefficient matrices.

7. The method of claim 4, further comprising the step of:
losslessly compressing said control words.

8. The method of claim 7, further comprising the steps of:
transmitting said compressed data blocks and said compressed control words to a receiver;
decoding said compressed control words and compressed data blocks; and
performing block artifact reduction on said decoded data blocks.

9. The method of claim 1, wherein said data comprises time-series data.

10. A hardware system of compressing data, comprising means for approximating said data using Chebyshev polynomials, further comprising:
means for dividing said data into data blocks of a predetermined size, to form matrices corresponding to each data block;
means for transforming the data in each matrix using Chebyshev polynomials to form corresponding matrices of Chebyshev coefficients; and
means for creating compressed data using the Chebyshev coefficients.

11. The system of claim 10, said means for creating compressed data using the Chebyshev coefficients further comprising:
means for thresholding the Chebyshev coefficients in each matrix to retain in each matrix only Chebyshev coefficients that are of a predetermined value.

12. The system of claim 11, further comprising:
means for quantizing said Chebyshev coefficient matrices to create a compressed data block corresponding to each of said data blocks.

13. The system of claim 12, further comprising:
means for creating control words for each of said compressed data blocks, said control enabling decompression of said compressed data blocks in proper sequence.

14. The system of claim 13, wherein said means for quantizing comprises:
means for performing floating point quantization on said Chebyshev coefficient matrices.

15. The system of claim 13, wherein said means for quantizing comprises:
means for performing inverse hyperbolic sine compander quantization on said Chebyshev coefficient matrices.

16. The system of claim 13, further comprising:
means for losslessly compressing said control words.

17. The system of claim 16, further comprising:
means for transmitting said compressed data blocks and said compressed control words to a receiver;
means for decoding said compressed control words and compressed data blocks; and
means for performing block artifact reduction on said decoded data blocks.

18. The system of claim 10, wherein said data comprises time-series data.

19. A computer program product recorded on computer readable storge medium for compressing data, comprising computer readable means for approximating said data using Chebyshev polynomials, further comprising:
computer readable means for dividing said data into data blocks of a predetermined size, to form matrices corresponding to each data block;
computer readable means for transforming the data in each matrix using Chebyshev polynomials to form corresponding matrices of Chebyshev coefficients; and
computer readable means for creating compressed data using the Chebyshev coefficients.

20. The computer program product of claim 19, said computer readable means for creating compressed data using the Chebyshev coefficients further comprising:
computer readable means for thresholding the Chebyshev coefficients in each matrix to retain in each matrix only Chebyshev coefficients that are of a predetermined value.

21. The computer program product of claim 20, further comprising:
computer readable means for quantizing said Chebyshev coefficient matrices to create a compressed data block corresponding to each of said data blocks.

22. The computer program product of claim 21, further comprising:
computer readable means for creating control words for each of said compressed data blocks, said control enabling decompression of said compressed data blocks in proper sequence.

23. The computer program product of claim 22, wherein said computer readable means for quantizing comprises:
computer readable means for performing floating point quantization on said Chebyshev coefficient matrices.

24. The computer program product of claim 22, wherein said computer readable means for quantizing comprises:
computer readable means for performing inverse hyperbolic sine compander quantization on said Chebyshev coefficient matrices.

25. The computer program product of claim 22, further comprising:
computer readable means for losslessly compressing said control words.

26. The computer program product of claim 25, further comprising:
computer readable means for transmitting said compressed data blocks and said compressed control words to a receiver;
computer readable means for decoding said compressed control words and compressed data blocks; and
computer readable means for performing block artifact reduction on said decoded data blocks.

27. The computer program product of claim 19, wherein said data comprises time-series data.

* * * * *